(12) United States Patent
Gowda et al.

(10) Patent No.: US 11,977,741 B2
(45) Date of Patent: May 7, 2024

(54) SYSTEM AND METHOD FOR ACQUIRING AND USING AUDIO DETECTED DURING OPERATION OF A HARD DISK DRIVE TO DETERMINE DRIVE HEALTH

(71) Applicant: Dell Products L.P., Round Rock, TX (US)

(72) Inventors: Deepak Gowda, Cary, NC (US); Sathish Kumar Bikumala, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 78 days.

(21) Appl. No.: 17/155,272

(22) Filed: Jan. 22, 2021

(65) Prior Publication Data

US 2022/0236887 A1 Jul. 28, 2022

(51) Int. Cl.
*G06F 3/06* (2006.01)
*H03M 1/12* (2006.01)

(52) U.S. Cl.
CPC .......... *G06F 3/0619* (2013.01); *G06F 3/0616* (2013.01); *G06F 3/0653* (2013.01); *G06F 3/0673* (2013.01); *H03M 1/12* (2013.01)

(58) Field of Classification Search
CPC ........ H03M 1/12; G06F 11/07; G06F 3/0619; G06F 3/0616; G06F 3/0653; G06F 3/0673
See application file for complete search history.

(56) References Cited

U.S. PATENT DOCUMENTS

| | | | |
|---|---|---|---|
| 9,099,101 B1* | 8/2015 | Kudo | G11B 5/012 |
| 9,911,442 B1* | 3/2018 | Kharisov | G11B 5/5565 |
| 11,348,599 B1* | 5/2022 | Gowda | G06N 3/08 |
| 2004/0034482 A1* | 2/2004 | Gross | G11B 20/1816 |
| 2004/0205403 A1* | 10/2004 | Markow | G11B 27/36 714/30 |
| 2006/0212755 A1* | 9/2006 | Urmanov | G11B 20/1816 714/25 |
| 2007/0070540 A1* | 3/2007 | Noguchi | G11B 5/59694 |
| 2007/0258599 A1* | 11/2007 | Mao | H04R 3/00 381/71.1 |
| 2008/0019246 A1* | 1/2008 | Sutardja | G11B 33/12 |
| 2008/0180084 A1* | 7/2008 | Dougherty | G11B 27/36 |

(Continued)

OTHER PUBLICATIONS

Paudyal, Santosh, Md Saifuddin Ahmed Atique, and Cai Xia Yang, "Local maximum acceleration based rotating machinery fault classification using KNN," May 2019, 2019 IEEE International Conference on Electro Information Technology (EIT), pp. 219-224 ( Year: 2019).*

*Primary Examiner* — Matthew M Kim
*Assistant Examiner* — Matthew N Putaraksa
(74) *Attorney, Agent, or Firm* — Terrile, Cannatti & Chambers, LLP; Stephen A. Terrile

(57) ABSTRACT

A method, system, and computer-usable medium are disclosed for acquiring and using audio detected during operation of a hard disk drive to determine the status of the hard disk drive. One general aspect of the disclosure is directed to a computer-implemented method that includes receiving analog audio detected by an audio transducer in proximity to moving mechanical components of a hard disk drive, converting the received analog audio to digital audio, and assigning a health classification status to the hard disk drive based on a classification of the digital audio.

22 Claims, 8 Drawing Sheets

(56) References Cited

U.S. PATENT DOCUMENTS

| | | | | |
|---|---|---|---|---|
| 2008/0255839 A1* | 10/2008 | Larri | ............... | G10L 15/06 |
| | | | | 704/238 |
| 2013/0106637 A1* | 5/2013 | Liao | ............... | H04L 25/067 |
| | | | | 341/155 |
| 2013/0114162 A1* | 5/2013 | Zhang | ............... | G11B 5/59694 |
| | | | | 29/603.03 |
| 2016/0245209 A1* | 8/2016 | Bizub | ............... | F02D 41/1497 |
| 2017/0147458 A1* | 5/2017 | Epstein | ............... | G06F 11/00 |
| 2020/0389188 A1* | 12/2020 | Belzer | ............... | H03M 13/2957 |

* cited by examiner

| Audio file(s) | Health classification (Label) |
|---|---|
| Gold_standard_1.wav<br>. . .<br>Gold_standard_n.wav | excellent_harddisk |
| vghdd_1.wav<br>...<br>vghdd_n.wav | verygood_harddisk |
| ghdd_1.wav<br>...<br>ghdd_n.wav | good_harddisk |
| phdd_1.wav<br>...<br>phdd_n.wav | poor_harddisk |
| schdd_1.wav<br>...<br>schdd_n.wav | scratches_on_harddisk |
| bshdd_1.wav<br>...<br>bshdd_n.wav | badsectors_harddisk |
| spihdd_1.wav<br>...<br>spihdd_n.wav | spindle_issue_harddisk |
| brihdd_1.wav<br>...<br>brihdd_n.wav | bearing_issue_harddisk |
| hdihdd_1.wav<br>...<br>hdihdd_n.wav | headissue_hardisk |

SYSTEM AND METHOD FOR ACQUIRING AND USING AUDIO DETECTED DURING OPERATION OF A HARD DISK DRIVE TO DETERMINE DRIVE HEALTH

BACKGROUND OF THE INVENTION

Field of the Invention

The present invention relates to information handling systems. More specifically, embodiments of the invention relate to a system and method for acquiring and using audio detected during the operation of a hard disk drive to determine the health of the drive.

Description of the Related Art

As the value and use of information continue to increase, individuals and businesses seek additional ways to process and store information. One option available to users is an information handling system (IHS). An IHS generally processes, compiles, stores, and/or communicates information or data for business, personal, or other purposes, thereby allowing users to take advantage of the value of the information. Because technology and information handling needs and requirements vary between different users or applications, IHS may also vary regarding what information is handled, how the information is handled, how much information is processed, stored, or communicated, and how quickly and efficiently the information may be processed, stored, or communicated. IHS variations allow for information handling systems to be general or configured for a specific user or specific use such as financial transaction processing, airline reservations, enterprise data storage, or global communications. In addition, information handling systems may include various hardware and software components that may be configured to process, store, and communicate information and may include one or more computer systems, data storage systems, and networking systems.

IHS often use storage devices, such as hard disk drives (HDD), to store programs and data. However, HDD are subject to failures. An HDD failure occurs when an HDD malfunctions and the stored information cannot be accessed with a properly configured computer. An HDD may fail in several ways. Failure may be immediate and total, progressive, or limited. Data may be destroyed or partially or totally recoverable. Other failures, which may be either progressive or limited, are usually considered to be a reason to replace an HDD since the value of data potentially at risk usually far outweighs the cost saved by continuing to use a drive that may be failing.

SUMMARY OF THE INVENTION

A system of one or more computers can be configured to perform particular operations or actions by virtue of having software, firmware, hardware, or a combination of them installed on the system that in operation causes or cause the system to acquire and use audio detected during operation of a hard disk drive to determine the status of the hard disk drive.

One general aspect of the disclosure is directed to a computer-implemented method that includes receiving analog audio detected by an audio transducer in proximity to moving mechanical components of a hard disk drive, converting the received analog audio to digital audio, and assigning a health classification status to the hard disk drive based on a classification of the digital audio.

In at least one embodiment of the disclosed system, the audio is received from an audio transducer that is in fixed alignment with and/or mounted to a hard disk drive controller board of the hard disk drive. The audio transducer is at a location at which it can detect audio resulting from operation of the moving mechanical components of the hard disk drive.

In at least one embodiment of the disclosed system, a health classification is assigned to the hard disk drive based on an analysis of the digital audio. In at least one embodiment, the digital audio analysis is based on a comparison of the digital audio with digital audio generated by moving components of a failing hard disk drive. In at least one embodiment, the assignment of the health classification to the hard disk drive may include: using the hard disk drive controller to execute a trained hard disk drive health classifier, where the hard disk drive health classifier includes a neural network that has been trained using digital audio generated by moving components of a failing hard disk drive. Other embodiments include corresponding hard disk drive systems, apparatus, and computer programs stored on one or more storage devices of the hard disk drive system that perform the actions of the methods.

BRIEF DESCRIPTION OF THE DRAWINGS

The present invention may be better understood, and its numerous objects, features, and advantages made apparent to those skilled in the art by referencing the accompanying drawings. The use of the same reference number throughout the several figures designates a like or similar element.

FIG. 5 is a table showing audio file names and corresponding labels that may be included in the labeled training audio sample data used to train the machine learning models of the disclosed system.

DETAILED DESCRIPTION

Figure 1:
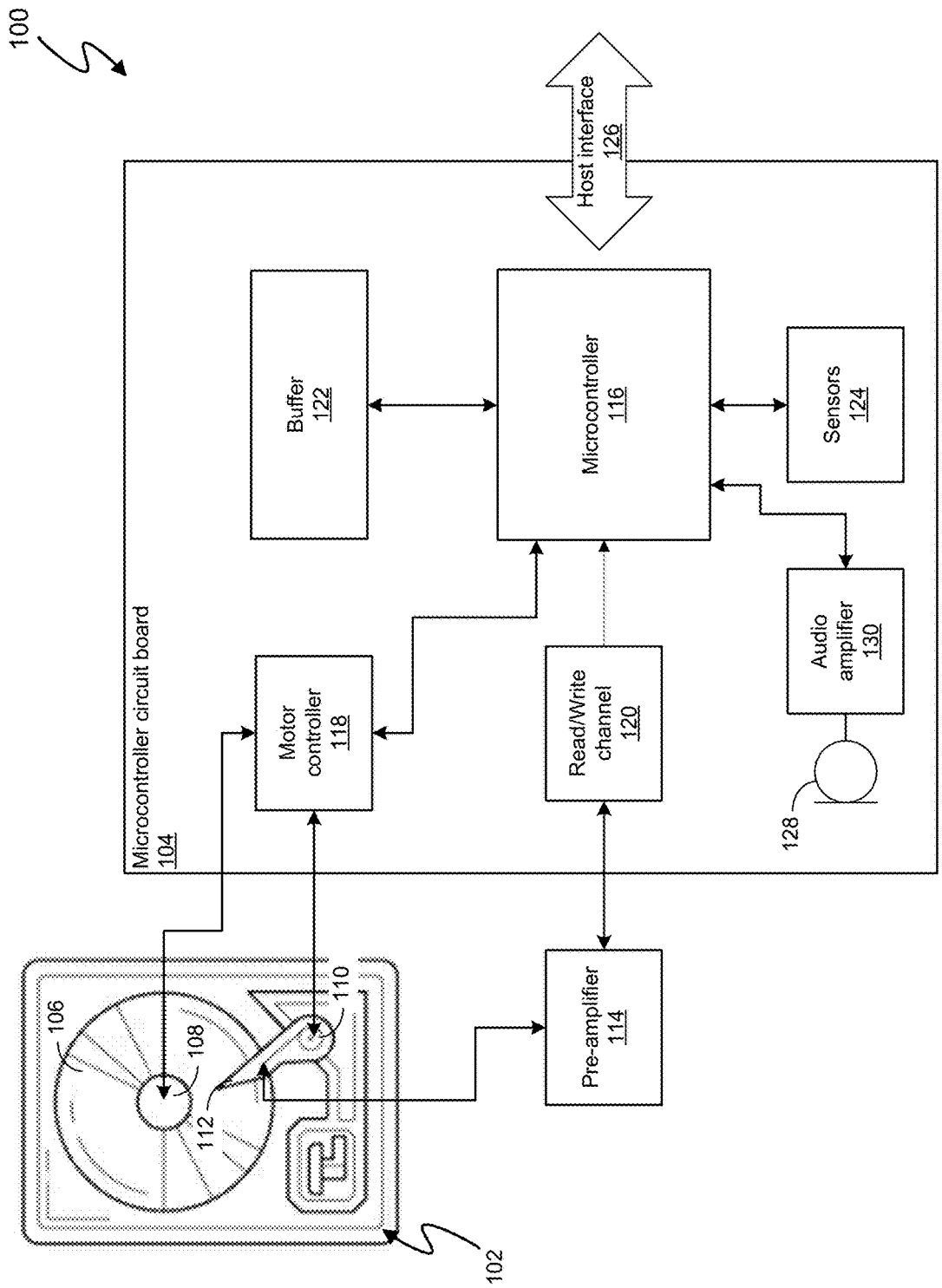
FIG. 1 is a generalized illustration of one example of a hard disk drive (HDD).

Systems, methods, and computer-readable medium are disclosed for use in determining the health of a hard disk drive. Existing hard disk drives (HDD) often include SMART functionality intended to detect conditions under which the HDD is operating. SMART (Self-Monitoring Analysis and Reporting Technology) was created to monitor the disk status using various methods and devices (sensors). A single HDD may have up to 30 such measured values, which are called attributes. Some attributes directly or indirectly affect hard disk health status, and others merely give statistical information. Most existing HDD implement some sort of SMART functionality. However, SMART features and implementation are not completely standardized.

Although some of the HDD attributes monitored by SMART functionality may be used to determine the health of the HDD, certain embodiments of the disclosed system are implemented with a recognition that current sensors and corresponding attributes are not fully capable of monitoring the health of the hardware components of an HDD. Failure of hardware components constitutes one of the modes of HDD failure since hardware components degrade over a long period before causing the imminent failure. Certain embodiments of the disclosed system are implemented with a recognition that existing SMART attributes cannot adequately assess the health of hardware components of the HDD.

Certain embodiments of the disclosed system address the health of the HDD's components by detecting the sounds made by the hardware components during the operation of the HDD. To this end, certain embodiments receive analog audio detected by an audio transducer in proximity to the hardware components of the HDD and convert the received analog audio to digital audio. A health classification of the HDD may be assigned to the HDD based on the classification of the digital audio. In certain embodiments, the audio transducer is in fixed alignment with or otherwise mounted to an HDD controller board along with an amplifier that amplifies the signal from the audio transducer.

Certain embodiments of the disclosed system process and analyze digital audio acquired during operation of the HDD to identify problems that may lead to HDD failure. Exemplary modes of HDD failure that may be detected by certain embodiments of the disclosed system include one or more of: a head crash (e.g., when a head contacts the rotating magnetic platter due to mechanical shock or other reasons); head stiction (e.g., when the head tends to stick to the magnetic platter); circuit failure (e.g., a failure of circuits to correctly operate and control the HDD); and bearing and motor failure (e.g., a failure of the electric motors and/or bearings of the HDD).

Certain embodiments of the disclosed system determined the health status of the HDD through the classification of the digital audio using one or more interconnected machine learning models. In certain embodiments, the digital audio may be provided to an input of an audio feature extractor to generate one or more feature vectors. The one or more feature vectors may be provided to the input of an HDD health classifier, which provides an output classification corresponding to the health status of the HDD based on the one or more feature vectors. In certain embodiments, the audio feature extractor and HDD health classifier include machine learning models, such as neural networks, that have been trained using the audio of HDDs operating at various failure stages.

FIG. 1 is a generalized illustration of one example of an HDD 100. The exemplary HDD 100 includes a main body 102 supporting moving hardware components of the HDD, and a microcontroller circuit board 104 supporting various electronic circuits used to control the hardware components supported on the main body 102. In many HDD, the microcontroller circuit board 104 is mounted to a reverse side of the main body 102.

The main body 102 of the HDD 100 supports one or more magnetic platters 106 that store the data of the HDD. The magnetic platters 106 are connected for rotation to a spindle motor 108. An armature 110 is used to drive a read/write head 112 to various portions of the magnetic platters 106 to write and read data to and from the surface of the magnetic platters 106. Signals provided to and received from the read/write head 112 may be processed by a preamplifier 114. In certain HDD embodiments, the preamplifier 114 is disposed on the main body 102, while in other embodiments, the preamplifier 114 is mounted to the microcontroller circuit board 104.

The microcontroller circuit board 104 includes the electronic circuits used to control and operate the HDD 100. In the example shown in FIG. 1, the microcontroller circuit board 104 includes a microcontroller 116 that may include a processor, program memory storing software executable by the processor to operate the HDD 100, I/O interfaces, analog-to-digital converters, as well as other electronic components. In certain embodiments, the microcontroller 116 may be implemented as a custom system-on-a-chip (SOC).

In FIG. 1, the microcontroller 116 is configured to interface with a motor controller 118, a read/write channel 120, a data buffer 122, and a host interface 126. The microcontroller 116 may also interface with sensors 124, such as accelerometers, temperature sensors, etc., that may be used by a SMART system.

HDD 100 also includes an audio transducer 128, such as a microphone. The audio transducer 128 is positioned within the HDD to detect sound generated by the moving components (e.g., platters 106, spindle motor 108, head 112, armature 110, etc.). In one example, the audio transducer 128 is in fixed alignment with the microcontroller circuit board 104 and, in some embodiments, is mounted directly to the microcontroller circuit board 104. The output of the audio transducer 128 may be provided to the input of an audio amplifier 130. In certain embodiments, depending on the location of the audio transducer 128, the audio amplifier is mounted to the microcontroller circuit board 104.

Figure 2:
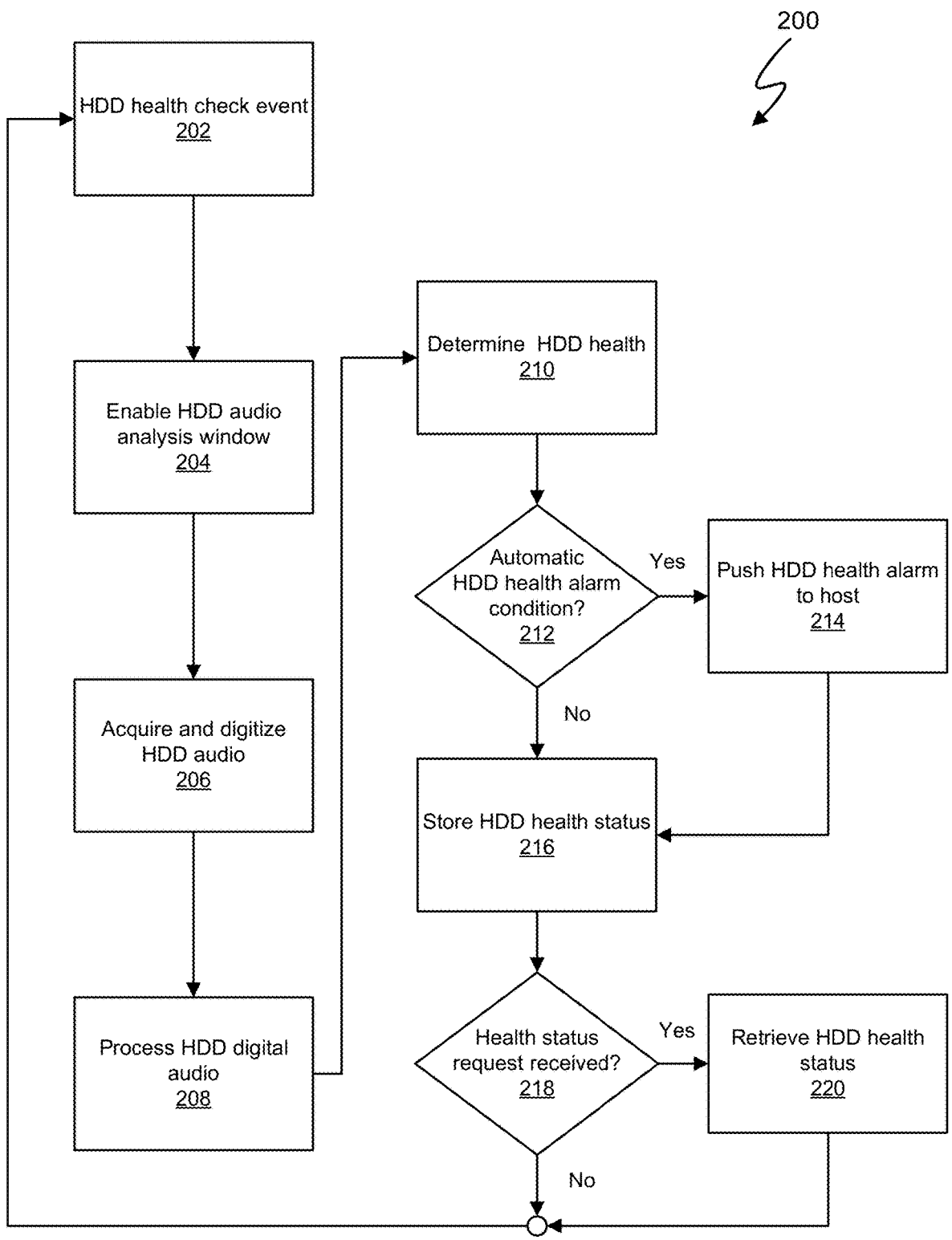
FIG. 2 is a flowchart depicting exemplary operations that may be executed in certain embodiments of the disclosed HDD system.

FIG. 2 is a flowchart 200 depicting exemplary operations that may be executed in certain embodiments of the disclosed HDD system. In this example, operations for checking the health of the HDD are initiated when an HDD health check event is detected at operation 202. There is a wide range of events that may give rise to the initiation of the health check. For example, a health check may be initiated in response to one or more specific HDD operations, such as the occurrence of a read operation, a write operation, a park operation of the heads, etc. Additionally, or in the alternative, the health check may be initiated based on a testing schedule. Additionally, or in the alternative, the health check may be initiated in response to the one or more HDD errors detected, for example, by the SMART system. In certain embodiments, the health check may be started as soon as the HDD is powered on. In certain embodiments, the health check may be continuous and need not be initiated in response to any particular event.

In the example shown in FIG. 2, an HDD audio analysis window is enabled at operation 204. The HDD audio analysis window may define a time frame during which HDD audio is to be recorded. Additionally, or on the alternative, the HDD audio analysis window may define a time frame during which pre-recorded HDD audio is to be analyzed. The time frame duration may be based on the total time (e.g., milliseconds) and/or the number of audio samples that are to be acquired for analysis (e.g., based on the sampling rate).

At operation 206, the audio detected by the audio transducer is acquired and digitized. The HDD digital audio may be processed at operation 208, and the operational status of the HDD may be determined at operation 210. The status corresponds to health-related operations of the HDD and may include HDD health status classifications such as those disclosed herein.

The HDD health status may be checked at operation 212 to determine whether the health status warrants pushing an HDD health alarm to the host and/or SMART system. In one example, an alarm may be generated when the health status results from the detection of HDD sound corresponding to an imminent hardware failure. In another example, an alarm may be generated when the health status results from the detection of HDD sound corresponding to an excessive wear condition of a hardware component that may ultimately result in a hardware failure if left unmitigated. Other health status conditions may also result in the generation of an HDD health alarm. If warranted, an HDD health alarm is pushed to the host and/or SMART system at operation 214.

A record may be maintained of the HDD health status detected during the health status detection operations. To this end, the HDD health status for each health status analysis cycle may be stored in memory at operation 216. When a health status request is received at operation 218, the current health status and/or health status history is retrieved at operation 220. The retrieved health status may be pushed to the host for display to a user, provided to diagnostic software, etc.

Figure 3:
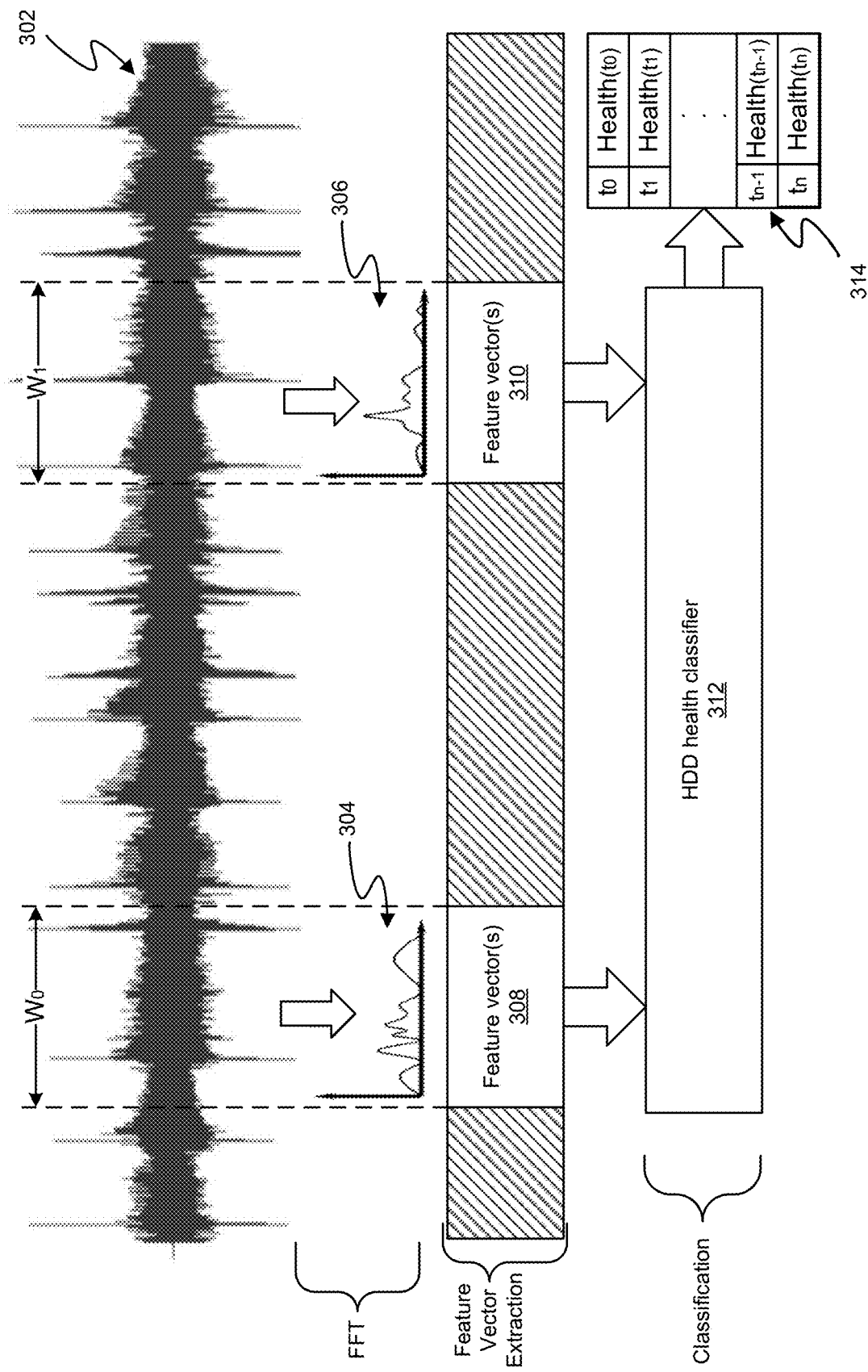
FIG. 3 depicts exemplary operations that may be executed in certain embodiments of the disclosed system.

FIG. 3 depicts exemplary operations that may be executed in certain embodiments of the disclosed system. In FIG. 3, the analog audio waveform detected by the audio transducer (and, when applicable, amplified by an audio amplifier) is shown at waveform 302. In certain embodiments, only selected portions of the analog audio waveform are subject to further processing. Here, only audio occurring during the analysis windows $W_0$ and $W_1$ is digitized and analyzed. In certain embodiments, the audio during window $W_0$ is analyzed using a Fast Fourier Transform (FFT) operation and generates a frequency power spectrum for the audio, as shown in spectral graph 304. Certain embodiments perform an FFT analysis of the audio occurring during window $W_1$ and generate the frequency power spectrum for the audio shown in spectral graph 306. It will be recognized that the spectral graphs 304 and 306 are graphic representations of digital data points that are stored in memory as a result of the FFT analyses.

In certain embodiments, the power spectrum data shown in spectral graphs 304 and 306 are subject to a feature vector extraction operation. In the example shown in FIG. 3, the application of the feature vector extraction operation on power spectrum data shown in spectral graph 304 results in the extraction of one or more feature vectors 308. The feature vector extraction operation on the power spectrum data shown in spectral graph 306 results in the extraction of one or more feature vectors 310.

In certain embodiments, the feature vectors 308 and 310 are subject to a classification operation. To this end, feature vectors 308 and 310 may be provided to an HDD health classifier 312, which analyzes the feature vectors 308 and 310 and assigns HDD health classifications to the audio detected during the analysis windows $W_0$ and $W_1$. In one example, a health classification may be respectively assigned to each analysis window $W_0$, $W_1$. Additionally, or in the alternative, a single health classification may be assigned based on an aggregate classification of audio occurring in multiple windows, such as windows $W_0$ and $W_1$.

The results of the health classifications as determined at different times may be stored as a table in memory. In the example shown in FIG. 3, health classification data is stored in a table such as health status table 314. The health status table 314 may include a time-stamped health status data, where $t_x$ is the time at which the health status was determined, and Health($t_x$) corresponds to the health status at time $t_x$.

Figure 4:
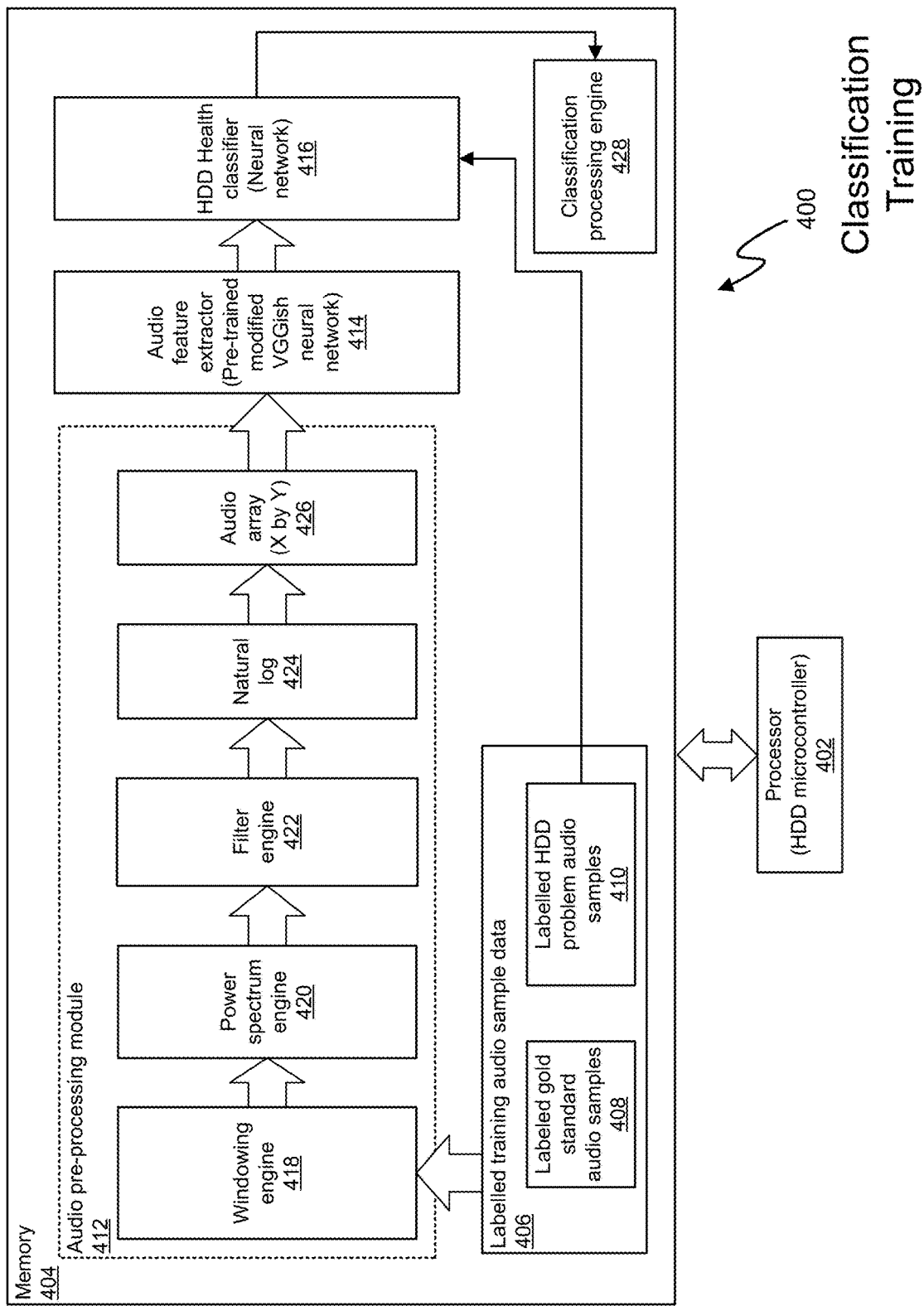
FIG. 4 is a block diagram of an exemplary embodiment of an HDD health classification system during classification training.

FIG. 4 is a block diagram of an exemplary embodiment of an HDD health classification system 400 during classification training. In this example, the HDD health classification system 400 includes a processor 402 and electronic memory 404. The electronic memory 404 is accessible to the processor 402 and includes instructions that are executable by the processor 402 to perform various functions used in the processing and analysis of sound occurring during the operation of the HDD. In at least one embodiment, the processor 402 is a processor included in a microcontroller on a microcontroller circuit board of the HDD.

In at least one embodiment, electronic memory 404 is implemented in storage devices that are local to the HDD so that the acquisition, analysis, and classification operations of the HDD health classification system 400 may take place locally at the HDD. The instructions included in electronic memory 404 may be consolidated in a single memory device or distributed across multiple memory devices. In one example, the electronic memory 404 may be an element internal to the microcontroller. Additionally, or in the alternative, the electronic memory 404 may include one or more memory devices external to the microcontroller yet accessible to the processor 402.

The HDD health classification system 400 shown in FIG. 4 is trained using labeled training audio sample data 406. The audio sample data 406 is stored as digital audio in memory 404 and is accessible by the processor 402. In certain embodiments, the audio sample data 406 may include labeled gold standard audio sample data 408 corresponding to the sounds made by a new HDD in various stages of operation (e.g., read, write, park, spin-up, spin-down, etc.). The gold standard audio sample data 408 may be used as the standard against which all other sounds made by the HDD are gauged. In certain embodiments, the gold standard audio sample data 408 is unique to each HDD and recorded by the HDD health classification system 400 during testing of the completed HDD assembly on the manufacturing floor. In certain embodiments, the gold standard audio sample data 408 is generic to the model of the HDD assembly. In such instances, a gold standard HDD is selected as a representative of all HDDs of a similar model, and the gold standard audio sample data 408 includes recordings of the sounds made by the gold standard HDD in various stages of operation.

The labeled training audio sample data 406 may also include labeled HDD problem audio sample data 410. The labeled HDD problem audio sample data may include pre-recorded samples of sounds made by HDD having various types of health issues. FIG. 5 is a table 500 showing audio file names and corresponding labels that may be included in the labeled training audio sample data 406. In FIG. 5, the HDD health classification system 400 is trained using multiple audio files associated with each health classification. As an example, audio files "Gold_standard_1.wav" through "Gold_standard_n.wav" may be used to train the HDD health classification system 400 to recognize HDD having a health classification of "excellent harddisk." As a further example, audio files "spihdd_1.wav" through "spihdd_n.wav" may be used to train the HDD health classification system 400 to recognize HDD having spindle issues with a health classification of "spindle_issue_harddisk." Table 500 shows examples of audio file names and corresponding health classifications that may be used to train the HDD health classification system 400. Although each health classification shown in table 500 is trained using "n" audio files, it will be recognized that the number of audio files used to train for a particular classification may vary. Further, it will be recognized that the health classifications shown in table 500 constitute non-limiting examples, and that health classifications in addition to or other than those shown in table 500 may be used.

With reference to FIG. 4, the labeled training audio sample data 406 may be subject to one or more audio pre-processing operations by an audio pre-processing module 412. The pre-processed audio sample data is used to train one or more interconnected machine learning neural networks, shown here as audio feature extractor 414 and HDD health classifier 416. In this example, the audio pre-processing module 412 includes a windowing engine 418. Certain embodiments of the windowing engine 418 convert the raw pulse-code modulation data of the .wav files to floats on a [−1.0, +1.0] scale. If there are two channels of audio, the elements are averaged to produce one channel. Certain embodiments of the windowing engine 418 resample the audio data to only 16,000 samples per second and break the data up into several overlapping windows. The windowing engine 418 may execute Hamming window operations on each of the overlapping windows.

The audio data processed by the windowing engine 418 is provided to a power spectrum engine 420 that is configured to calculate the frequency power spectrum of the data provided by the windowing engine 418. In certain embodiments, the operations performed by the power spectrum engine 420 include one or more FFT operations. Audio data having frequencies above and below certain thresholds are dropped using one or more filter banks 422. The filter banks 422 in certain embodiments also scale the audio data using, for example, a mel scaling operation. The audio data output by the filter banks 422 may be subject to a natural log operation by natural log engine 424. In certain embodiments, the operations executed by the audio pre-processing module generate an X×Y dimension audio array 426, which is used to train one or more machine learning models of the HDD health classification system 400. In certain embodiments, the audio pre-processing module 412 accepts 975 ms of audio as input (the exact input length being dependent on the sample rate) and produces an audio array 426 of shape (96, 64).

The implementation of the HDD health classification system 400 shown in FIG. 4 is implemented with two, serially arranged machine language classification models. In this example, the audio array 426 is provided to the input of the audio feature extractor 414, implemented here as a modified VGGish feature extractor stage. VGGish is a pretrained Convolutional Neural Network from Google's network and is inspired by the VGG networks used for image classification. The VGGish network includes a series of convolution and activation layers, optionally followed by a max pooling layer. The standard VGGish network contains a total of seventeen layers. The VGGish network used in the audio feature extractor 414 has been pre-trained using the standard audio data typically used to train such VGGish networks.

During the training of the HDD health classification system 400 the VGGish network remains static. However, certain embodiments of the audio feature extractor 414 are implemented as a modified VGGish network in which the last three layers of the original VGGish model have been removed. As such, the widest layer of the original VGGish network is used as the output layer of the audio feature extractor 414. The modified VGGish network in certain embodiments outputs a double vector of length 12,288. When implemented in non-Linux systems, the VGGish network may be eight bit quantized to reduce its size.

The output layer of the audio feature extractor 414 is provided to the input of the HDD health classifier 416. During training, the hyperparameters of the HDD health classifier 416 are tuned using the audio feature vectors and labels corresponding to the sample data generating the audio feature vectors. As an example, with reference to table 500 of FIG. 5, audio sample files "spihdd_1.wav" through "spihdd_n.wav" may respectively result in feature vectors $FV_{spi\_1}$ through $FV_{spi\_n}$ at the output of the audio feature extractor 414. The feature vectors $FV_{spi\_1}$ through $FV_{spi\_n}$ are provided to the input of the HDD health classifier 416 pursuant to training the HDD health classifier 416 to recognize feature vectors associated with the health classification "spindle_issue_harddisk." Similarly, audio sample files "brihdd_1.wav" through "brihdd_n.wav" may respectively result in feature vectors $FV_{bri\_1}$ through $FV_{bri\_n}$ at the output of the audio feature extractor 414. The feature vectors $FV_{bri\_1}$ through $FV_{bri\_n}$ are provided to the input of the HDD health classifier 416 pursuant to training the HDD health classifier 416 to recognize feature vectors associated with the health classification "bearing_issue_harddisk." Training of the HDD health classifier 416 may continue until the classifier has been trained to recognize feature vectors for all desired HDD health classifications.

The classification data output from the HDD health classifier 416 may be processed by classification processing engine 428. In certain embodiments, the classification processing engine 428 may format the classification data output for subsequent retrieval and processing in, for example, diagnostic and/or reporting functions.

Figure 6:
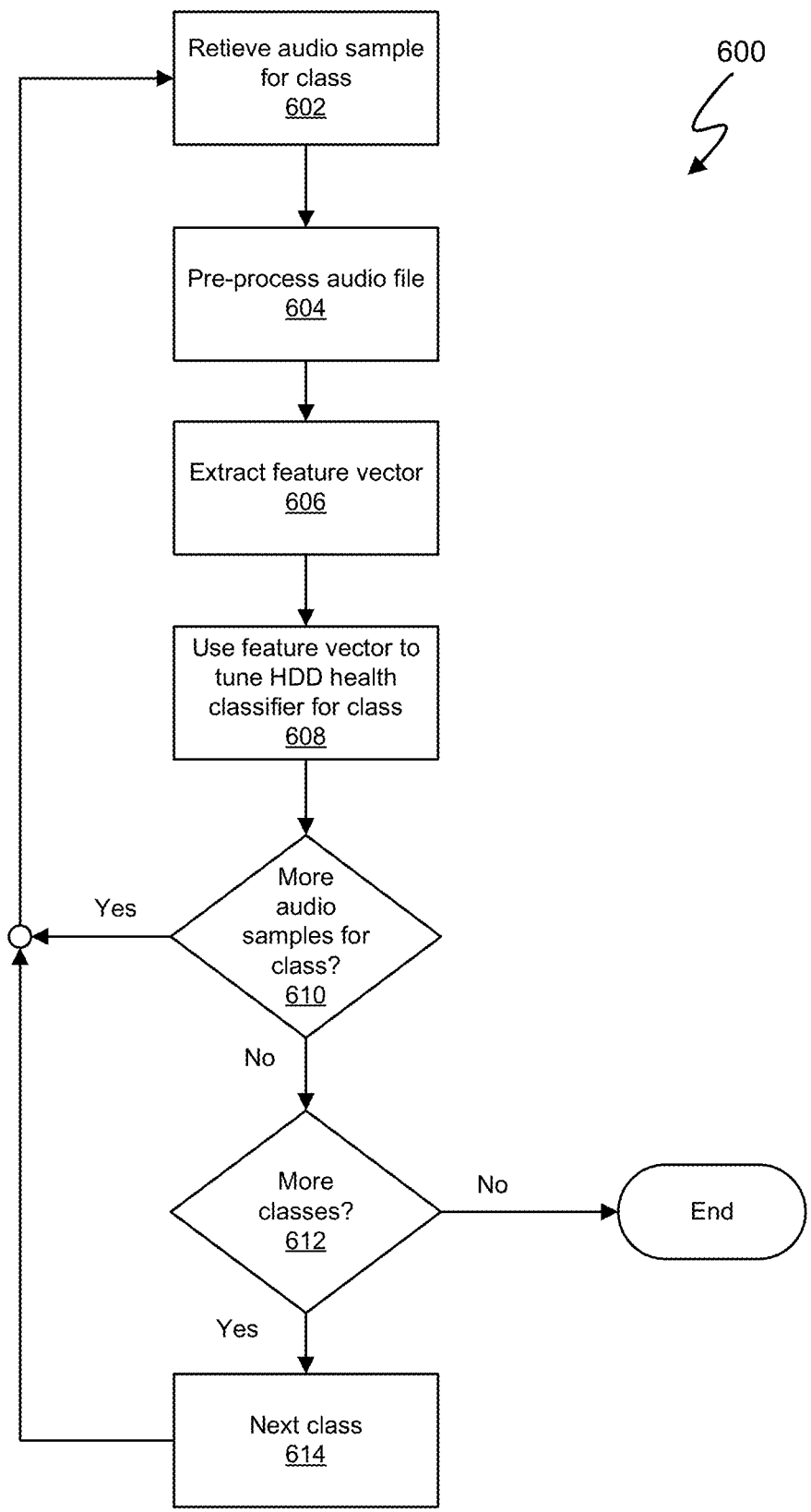
FIG. 6 is a flowchart depicting exemplary operations that may be executed during training of certain embodiments of the disclosed system.

FIG. 6 is a flowchart 600 depicting exemplary operations that may be executed during the training of certain embodiments of the disclosed system. In this example, an audio sample file is retrieved for a given classification at operation 602 and subject to audio pre-processing at operation 604. An audio feature vector is extracted using the audio of the audio sample file at operation 606. The audio feature vector and corresponding classification label are used to tune the HDD health classifier to recognize feature vectors associated with the corresponding classification label at operation 608. At operation 610, a check is made to determine whether there are more audio sample files associated with the given classification. If so, the next audio sample file is retrieved at operation 602 and used to continue the training of the HDD health classifier for the given classification. If there are no more audio sample files associated with the given classification, a check is made at operation 612 to determine whether there are audio files associated with training the HDD health classifier for other health classifications. If so, the next health classification is set at operation 614, and the corresponding audio files are retrieved and processed at operations 602 through 610 until the HDD health classifier has been trained for the next health classification using all of the audio sample files for the next health classification. The operations shown in the flowchart 600 may continue until all files of all classifications have been used to train the HDD health classifier.

Figure 7:
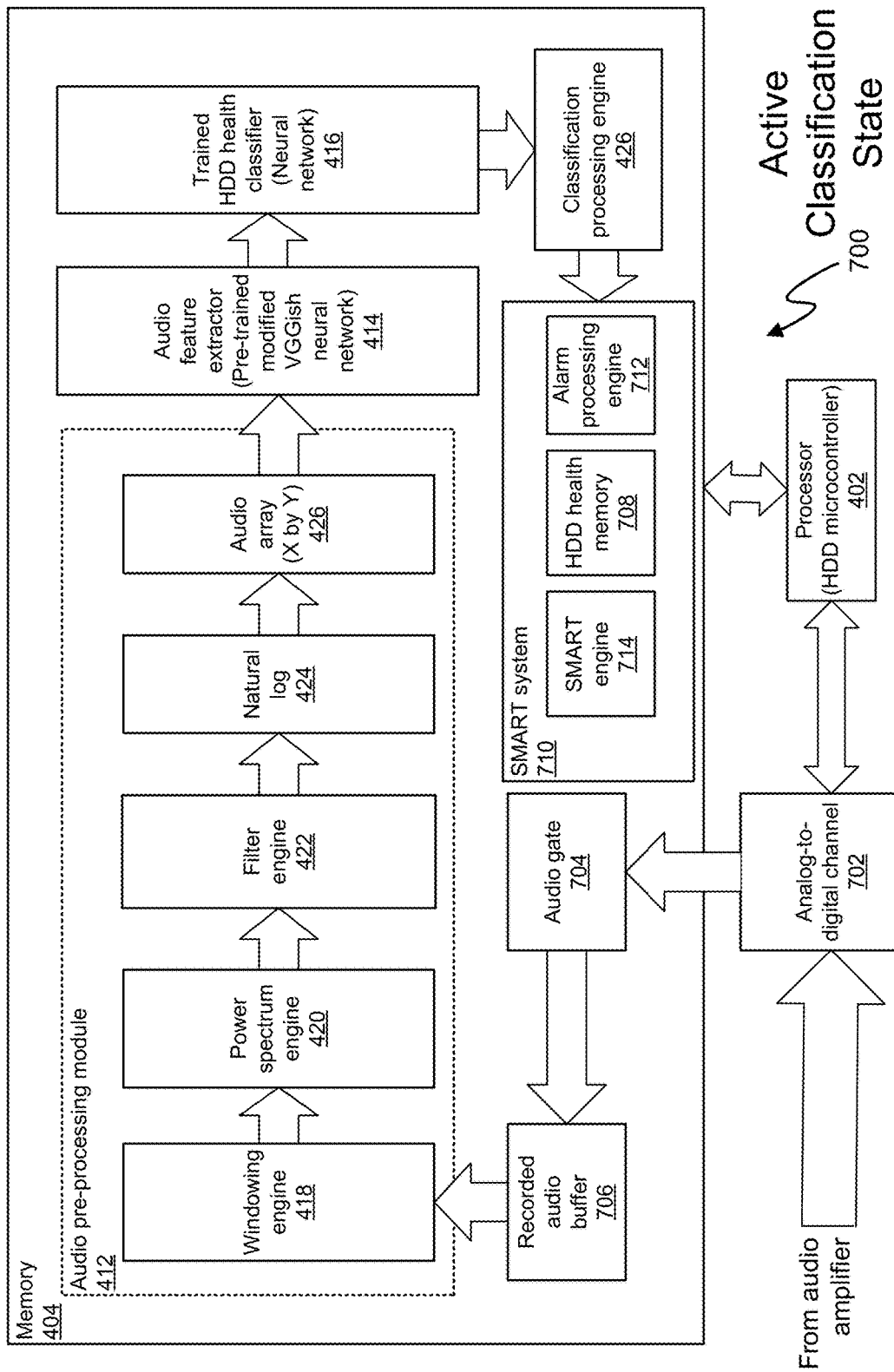
FIG. 7 is a block diagram of an exemplary embodiment of an HDD health classification system during active classification of the health of an HDD.

FIG. 7 is a block diagram of an exemplary embodiment of an HDD health classification system 400 during the active classification of the health of the HDD. In this example, sound is detected by an audio transducer and the resulting analog signal is amplified by an audio amplifier. The amplified analog audio is provided to an input of an analog-to-digital channel 702 for analog-to-digital conversion. The analog-to-digital channel 702 may be a channel implemented on the HDD microcontroller, or implemented as a separate device accessible to the processor 402.

In certain embodiments, the digital audio from the analog-to-digital channel 702 is provided to an audio gate 704, which may be used to limit the duration and/or size of the digital audio stored in recorded audio buffer 706.

In certain embodiments, data in the recorded audio buffer 706 is accessed by the audio pre-processing module 412. The processing result in the X×Y audio array 426, which is provided to the input layer of the audio feature extractor 414. The audio feature vector extracted by the audio feature extractor 414 is provided to the input layer of the trained HDD health classifier 416. The HDD health classifier 416, in turn, assigns a health classification to the feature vector and, as such, to the operation of the HDD.

In certain embodiments, the health classification provided at the output of the HDD health classifier 416 is provided to the classification processing engine 428 for formatting. In certain embodiments, the formatted health classification data may be stored in the HDD health memory 708 of a SMART system 710. In certain embodiments, the SMART system 710 includes an alarm processing engine 712 that is configured to monitor the HDD health classifications. When the alarm processing engine 712 detects the occurrence of an HDD health classification that requires immediate or expedited attention, the alarm processing engine 712 may generate a status alarm identifying the health classification. In addition to identifying the health classification, the status alarm may include information indicative of the urgency with which the HDD health should be addressed as well as potential remedial measures for addressing the HDD health. In certain embodiments, the alarm processing engine 712 may cooperate with a SMART engine 714 of the SMART system 710 to push an alarm notification to the host system for presentation to a user. In certain embodiments, the SMART engine 714 may integrate the health classification status of the HDD as an attribute of a new or existing SMART system 710.

Figure 8:
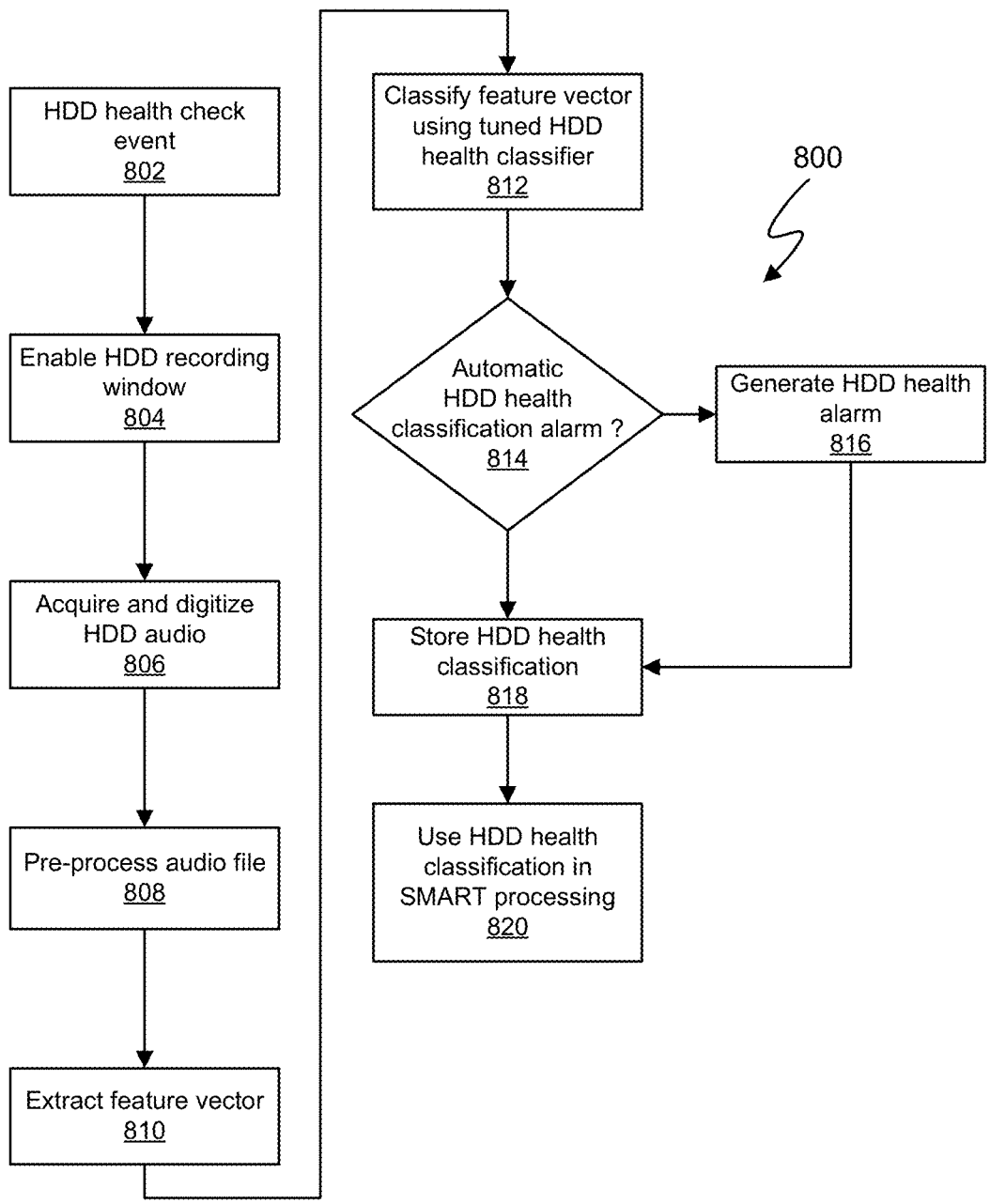
FIG. 8 is a flowchart depicting exemplary operations that may be executed in certain embodiments of the disclosed system during active classification of the health of an HDD.

FIG. 8 is a flowchart 800 depicting exemplary operations that may be executed in certain embodiments of the disclosed system during the active classification of the health of an HDD. In this example, an HDD health check event is detected at operation 802 and a recording window is enabled at operation 804. At operation 806, the sounds of the HDD operation are acquired and converted to digitized audio. The digitized audio is subject to audio pre-processing at operation 808, and one or more feature vectors of the pre-processed audio are extracted at operation 810. The extracted feature vectors are provided to the HDD health classifier at operation 812, which assigns an HDD health classification to the HDD based on the extracted feature vectors.

A determination is made at operation 814 as to whether the HDD health classification should trigger the generation of an alarm notification that should be pushed to the host. If so, the HDD health alarm is generated at operation 816, and the corresponding notification is pushed to the host system. Whether or not an alarm is generated, the HDD health classification may be stored in memory at operation 818. In certain embodiments, the HDD health classification is used in SMART processing at operation 820.

As will be appreciated by one skilled in the art, the disclosed system may be embodied as a method, system, or computer program product. Accordingly, embodiments of the disclosed system may be implemented in hardware, in software (including firmware, resident software, microcode, etc.) or in an embodiment combining software and hardware. Furthermore, the disclosed system may take the form of a computer program product on a computer-usable storage medium having computer-usable program code embodied in the medium.

Any suitable computer-usable or computer-readable medium may be utilized. The computer-usable or computer-readable medium may be, for example, but not limited to, an electronic, magnetic, optical, electromagnetic, infrared, or semiconductor system, apparatus, or device. More specific examples (a non-exhaustive list) of the computer-readable medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, or a magnetic storage device. In the context of this document, a computer-usable or computer-readable medium may be any medium that can contain, store, communicate, or transport the program for use by or in connection with the instruction execution system, apparatus, or device.

Computer program code for carrying out operations of the disclosed system may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

Embodiments of the disclosed system are described with reference to flowchart illustrations and/or block diagrams of methods, apparatus (systems) and computer program products according to embodiments of the disclosed system. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions/acts specified in the flowchart and/or block diagram block or blocks.

The disclosed system is well adapted to attain the advantages mentioned as well as others inherent therein. While the disclosed system has been depicted, described, and is defined by reference to particular embodiments, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention. Consequently, the invention is intended to be limited only by the spirit and scope of the appended claims, giving full cognizance to equivalents in all respects.

What is claimed is:

1. A computer-implemented method comprising:
   receiving analog audio detected by an audio transducer in proximity to moving mechanical components of a hard disk drive;
   converting the received analog audio to digital audio, the converting the received analog audio comprising extracting an audio feature from the received analog audio to provide a respective feature vector, the respective feature vector being one of a plurality of feature vectors; and
   assigning a health classification status to the hard disk drive based on a classification of the digital audio, the assigning the health classification status using a trained machine learning model, the trained machine learning model comprising a neural network, the neural network being trained using feature vectors corresponding to digital audio generated by moving components of a failing hard disk drive.

2. The computer-implemented method of claim 1, wherein the receiving audio comprises:
   receiving audio from the audio transducer, where the audio transducer is in fixed alignment with a hard disk drive controller board of the hard disk drive.

3. The computer-implemented method of claim 2, wherein receiving the analog audio comprises:
   receiving analog audio detected by the audio transducer, where the audio transducer is mounted to the hard disk drive controller board of the hard disk drive at a location on the hard disk drive controller board at which the audio transducer can detect audio resulting from operation of the moving mechanical components of the hard disk drive.

4. The computer-implemented method of claim 3, further comprising:
   amplifying the analog audio detected by the transducer using an audio amplifier, wherein the audio amplifier is mounted to the hard disk drive controller board; and
   converting the amplified analog audio to digital data, wherein the converting the amplified analog audio to digital data is executed by one or more components of the hard disk drive controller board.

5. The computer-implemented method of claim 1, wherein
   the hard disk drive includes a hard disk drive controller board, the hard disk drive controller board including:
   a hard disk drive controller;
   a motor controller configured to receive signals from the hard disk drive controller, wherein the motor controller is configured to control the moving mechanical components of the hard disk drive in response to the signals received from the hard disk drive controller;
   the audio transducer, wherein the audio transducer is located on the hard disk drive controller board at a position to detect sound from operation of the moving mechanical components of the hard disk drive;
   an audio amplifier configured for amplifying analog audio detected by the audio transducer; and
   an analog-to-digital converter configured for converting the amplified analog audio to digital audio.

6. The computer-implemented method of claim 5, wherein assigning the health classification to the hard disk drive comprises:
   using the hard disk drive controller to analyze the digital audio, wherein the analysis of the digital audio is based on a comparison of the digital audio with digital audio generated by moving components of the failing hard disk drive.

7. The computer-implemented method of claim 5, wherein assigning the health classification of the hard disk drive comprises:
   using the hard disk drive controller to execute a trained hard disk drive health classifier, wherein the hard disk drive health classifier includes the neural network that has been trained using digital audio generated by moving components of the failing hard disk drive.

8. The computer-implemented method of claim 1, wherein:
   each respective feature vector includes an audio feature vector and a corresponding feature vector label.

9. The computer-implemented method of claim 8, wherein:
   the audio feature vector and the corresponding feature vector label are stored in a table of feature vectors.

10. A system comprising:
    a hard disk drive controller;
    a non-transitory, computer-readable storage medium embodying computer program executable by the hard disk drive controller and configured for:
    receiving analog audio detected by an audio transducer in proximity to moving mechanical components of a hard disk drive;
    converting the received analog audio to digital audio, the converting the received analog audio comprising extracting an audio feature from the received analog audio to provide a respective feature vector, the respective feature vector being one of a plurality of feature vectors; and
    assigning a health classification status to the hard disk drive based on a classification of the digital audio, the assigning the health classification status using a trained machine learning model, the trained machine learning model comprising a neural network, the neural network being trained using feature vectors corresponding to digital audio generated by moving components of a failing hard disk drive.

11. The system of claim 10, wherein the receiving audio comprises:
    receiving audio from the audio transducer, where the audio transducer is in fixed alignment with a hard disk drive controller board of the hard disk drive.

12. The system of claim 11, wherein receiving the analog audio comprises:

receiving analog audio detected by the audio transducer, where the audio transducer is mounted to the hard disk drive controller board of the hard disk drive at a location on the hard disk drive controller board at which the audio transducer can detect audio resulting from operation of the moving mechanical components of the hard disk drive.

13. The system of claim 12, further comprising:
amplifying the analog audio detected by the transducer using an audio amplifier, wherein the audio amplifier is mounted to the hard disk drive controller board; and
converting the amplified analog audio to digital data, wherein the converting the amplified analog audio to digital data is executed by one or more components of the hard disk drive controller board.

14. The system of claim 10, wherein
the hard disk drive includes a hard disk drive controller board, the hard disk drive controller board including:
the hard disk drive controller;
a motor controller configured to receive signals from the hard disk drive controller, wherein the motor controller is configured to control the moving mechanical components of the hard disk drive in response to the signals received from the hard disk drive controller;
the audio transducer, wherein the audio transducer is located on the hard disk drive controller board at a position to detect sound from operation of the moving mechanical components of the hard disk drive;
an audio amplifier configured for amplifying analog audio detected by the audio transducer; and
an analog-to-digital converter configured for converting the amplified analog audio to digital audio.

15. The system of claim 14, wherein assigning the health classification to the hard disk drive comprises:
using the hard disk drive controller to analyze the digital audio, wherein the analysis of the digital audio is based on a comparison of the digital audio with digital audio generated by moving components of the failing hard disk drive.

16. The system of claim 14, wherein assigning the health classification of the hard disk drive comprises:
using the hard disk drive controller to execute a trained hard disk drive health classifier, wherein the hard disk drive health classifier includes the neural network that has been trained using digital audio generated by moving components of the failing hard disk drive.

17. A non-transitory, computer-readable storage medium embodying computer program code, the computer program code comprising computer executable instructions configured for:
receiving analog audio detected by an audio transducer in proximity to moving mechanical components of a hard disk drive;
converting the received analog audio to digital audio, the converting the received analog audio comprising extracting an audio feature from the received analog audio to provide a respective feature vector, the respective feature vector being one of a plurality of feature vectors; and
assigning a health classification status to the hard disk drive based on a classification of the digital audio, the assigning the health classification status using a trained machine learning model, the trained machine learning model comprising a neural network, the neural network being trained using digital audio generated by moving components of a failing hard disk drive.

18. The non-transitory, computer-readable storage medium of claim 17, wherein the instructions are configured for:
receiving audio from an audio transducer that is in fixed alignment with a hard disk drive controller board of the hard disk drive.

19. The non-transitory, computer-readable storage medium of claim 18, wherein the instructions are configured for:
receiving analog audio detected by an audio transducer that is mounted to the hard disk drive controller board of the hard disk drive at a location on the hard disk drive controller board at which the audio transducer can detect audio resulting from operation of the moving mechanical components of the hard disk drive.

20. The non-transitory, computer-readable storage medium of claim 19, wherein the instructions are further configured for:
converting the analog audio to digital data, wherein the converting the analog audio to digital data is executed by one or more components of the hard disk drive controller.

21. The non-transitory, computer-readable storage medium of claim 17, wherein
the instructions are configured for execution by a hard disk drive controller.

22. The non-transitory, computer-readable storage medium of claim 21, wherein the instructions are configured for:
using the hard disk drive controller to analyze the digital audio, wherein the analysis of the digital audio is based on a comparison of the digital audio with digital audio generated by moving components of the failing hard disk drive.

* * * * *